US009640603B2

(12) United States Patent
Padmanathan et al.

(10) Patent No.: US 9,640,603 B2
(45) Date of Patent: May 2, 2017

(54) SEMICONDUCTOR DEVICE AND METHOD OF FORMING INDUCTOR OVER INSULATING MATERIAL FILLED TRENCH IN SUBSTRATE

(71) Applicant: STATS ChipPAC, Ltd., Singapore (SG)

(72) Inventors: Meenakshi Padmanathan, Singapore (SG); Seung Wook Yoon, Singapore (SG); YongTaek Lee, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 75 days.

(21) Appl. No.: 14/332,631

(22) Filed: Jul. 16, 2014

(65) Prior Publication Data

US 2014/0327107 A1 Nov. 6, 2014

Related U.S. Application Data

(63) Continuation of application No. 12/493,049, filed on Jun. 26, 2009, now abandoned.

(51) Int. Cl.
*H01L 49/02* (2006.01)
*H01L 23/522* (2006.01)
*H01L 23/66* (2006.01)

(52) U.S. Cl.
CPC .......... *H01L 28/10* (2013.01); *H01L 23/5227* (2013.01); *H01L 23/66* (2013.01);
(Continued)

(58) Field of Classification Search
CPC ................. H01L 23/5227; H01L 28/10; H01L 2924/19015; H01L 2924/181; H01L 2224/0557
See application file for complete search history.

(56) References Cited

U.S. PATENT DOCUMENTS 5,372,967 A * 12/1994 Sundaram ............... H01L 27/08
257/E27.046
5,384,274 A    1/1995 Kanehachi
(Continued)

OTHER PUBLICATIONS

"High performance inductors on CMOS-grade trenched silicon substrate", IEEE, vol. 31, No. 00, 2008.*
(Continued)

*Primary Examiner* — Eva Y Montalvo
*Assistant Examiner* — Nga Doan
(74) *Attorney, Agent, or Firm* — Robert D. Atkins; Patent Law Group: Atkins and Associates, P.C.

(57) ABSTRACT

A semiconductor device has a trench formed in a substrate. The trench has tapered sidewalls and depth of 10-120 micrometers. A first insulating layer is conformally applied over the substrate and into the trench. An insulating material, such as polymer, is deposited over the first insulating layer in the trench. A first conductive layer is formed over the insulating material. A second insulating layer is formed over the first insulating layer and first conductive layer. A second conductive layer is formed over the second insulating layer and electrically contacts the first conductive layer. The first and second conductive layers are isolated from the substrate by the insulating material in the trench. A third insulating layer is formed over the second insulating layer and second conductive layer. The first and second conductive layers are coiled over the substrate to exhibit inductive properties.

19 Claims, 4 Drawing Sheets

(52) U.S. Cl.
CPC ......... *H01L 2224/0557* (2013.01); *H01L 2224/05573* (2013.01); *H01L 2224/16225* (2013.01); *H01L 2224/48091* (2013.01); *H01L 2224/73265* (2013.01); *H01L 2924/00014* (2013.01); *H01L 2924/13091* (2013.01); *H01L 2924/181* (2013.01); *H01L 2924/19015* (2013.01)

(56) References Cited

U.S. PATENT DOCUMENTS

| | | | |
|---|---|---|---|
| 5,884,990 | A | 3/1999 | Burghartz et al. |
| 6,002,161 | A | 12/1999 | Yamazaki |
| 6,249,039 | B1 | 6/2001 | Harvey et al. |
| 6,287,931 | B1 | 9/2001 | Chen |
| 6,492,708 | B2 | 12/2002 | Acosta et al. |
| 2002/0008301 | A1* | 1/2002 | Liou ............... H01L 27/08 257/531 |
| 2003/0011041 | A1 | 1/2003 | Acosta et al. |
| 2004/0145044 | A1 | 7/2004 | Sugaya et al. |
| 2006/0192267 | A1 | 8/2006 | Park et al. |
| 2006/0244157 | A1 | 11/2006 | Carson |
| 2007/0108583 | A1 | 5/2007 | Shim et al. |
| 2007/0210403 | A1 | 9/2007 | Sandhu |
| 2007/0262418 | A1 | 11/2007 | Degani et al. |
| 2009/0236671 | A1 | 9/2009 | Yakuwa |
| 2010/0078771 | A1* | 4/2010 | Barth ............... H01L 21/76898 257/621 |

OTHER PUBLICATIONS

"Silicon-embedded 3D toroidal air-core inductor with through-wafer interconnect for on-chip integration", IEEE 2012.*

* cited by examiner

SEMICONDUCTOR DEVICE AND METHOD OF FORMING INDUCTOR OVER INSULATING MATERIAL FILLED TRENCH IN SUBSTRATE

CLAIM TO DOMESTIC PRIORITY

The present application is a continuation of U.S. patent application Ser. No. 12/493,049, now abandoned, filed Jun. 26, 2009, which application is incorporated herein by reference.

FIELD OF THE INVENTION

The present invention relates in general to semiconductor devices and, more particularly, to a semiconductor device and method of forming an inductor over an insulating material filled trench in a substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. An increase in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

The inductors are typically formed as a coiled conductive layer over a surface of the substrate. The inductor must have a high Q factor for optimal RF performance. However, the Q factor can be reduced by inductive coupling losses between the inductor and substrate. To maintain a high Q inductor, a high resistivity substrate, in the range of 1000-3000 ohm-cm, is commonly used. Unfortunately, the high resistivity substrate adds excessive costs to the manufacturing process.

SUMMARY OF THE INVENTION

A need exists for a high Q inductor on a low cost substrate. Accordingly, in one embodiment, the present invention is a method of making a semiconductor device comprising the steps of providing a substrate, forming a trench in the substrate to follow a coiled path, conformally applying a first insulating layer into the trench, depositing an insulating material over the first insulating layer to fill the trench, forming a first conductive layer over the insulating material, and forming a second conductive layer over the first conductive layer as a coil to exhibit an inductive property. The insulating material in the trench isolates the first conductive layer and second conductive layer from the substrate.

In another embodiment, the present invention is a method of making a semiconductor device comprising the steps of providing a substrate, forming a trench in the substrate to follow a coiled path, conformally applying a first insulating layer into the trench, depositing an insulating material over the first insulating layer to fill the trench, and forming a first conductive layer over the insulating material as a coil to exhibit an inductive property.

In another embodiment, the present invention is a method of making a semiconductor device comprising the steps of providing a substrate including a trench formed in the substrate to follow a coiled path, depositing an insulating material in the trench, and forming a first conductive layer over the insulating material as a coil to exhibit an inductive property.

In another embodiment, the present invention is a semiconductor device comprising a substrate including a trench formed in the substrate to follow a coiled path. An insulating material is deposited in the trench. A first conductive layer is formed over the insulating material as a coil to exhibit an inductive property.

DETAILED DESCRIPTION OF THE DRAWINGS

Figure 1:
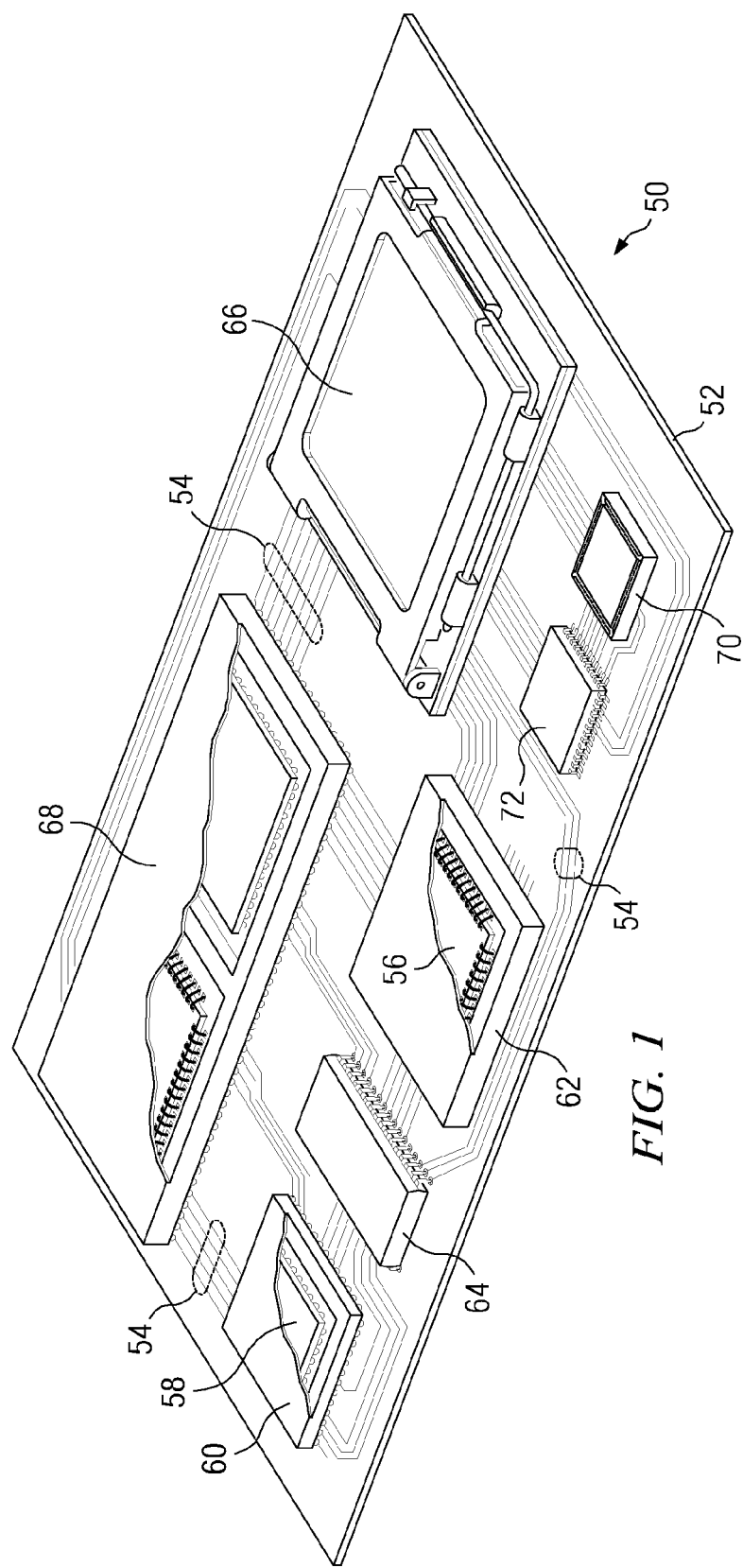
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
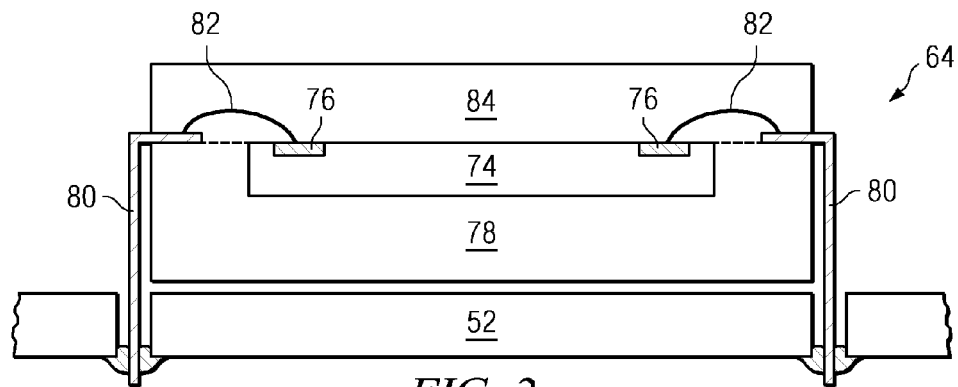
FIGS. 2a-2c illustrate further detail of the semiconductor packages mounted to the PCB.
Figure 2B:
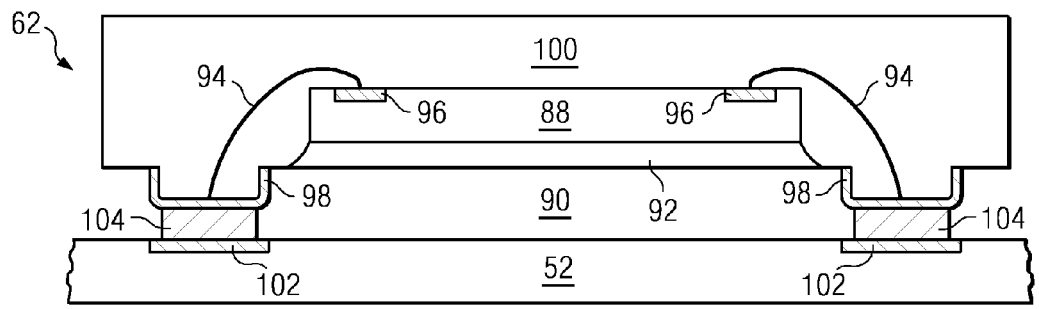
Figure 2C:
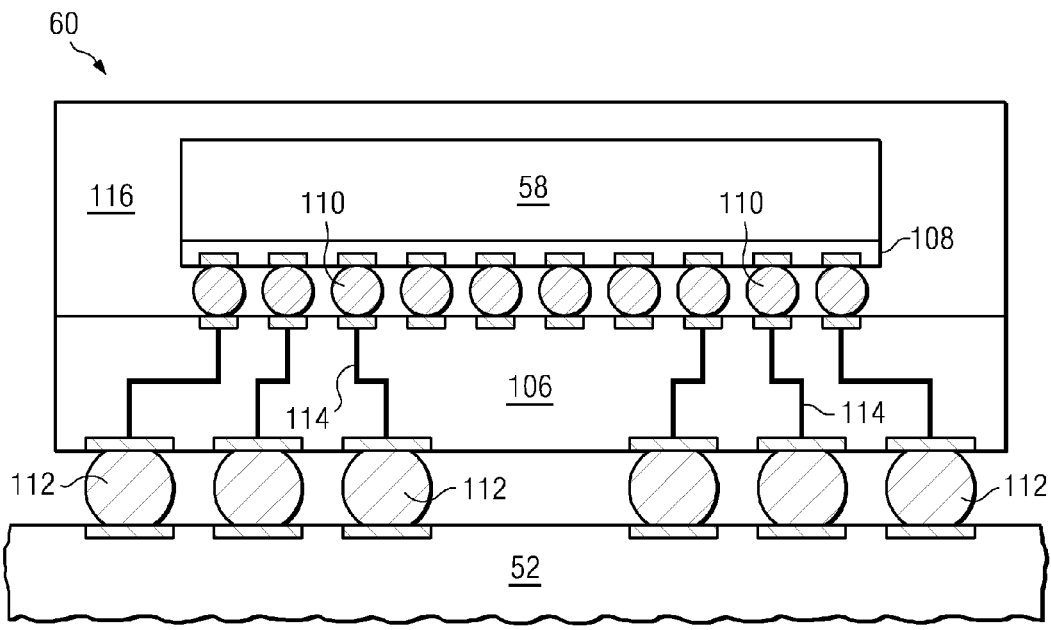

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
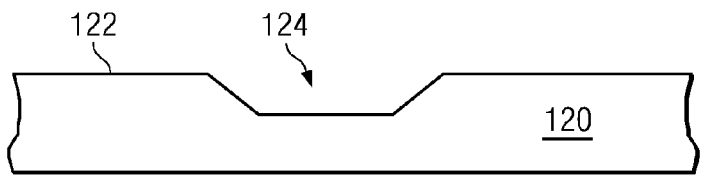
FIGS. 3a-3g illustrate a process of forming an inductor over an insulating material filled trench in a substrate.

FIG. 3a shows a substrate or wafer 120 made with a semiconductor base material such as silicon, germanium, gallium arsenide, indium phosphide, or silicon carbide. The semiconductor base material has a low resistivity, in the range of 10-30 ohm-cm. The low resistivity substrate 120 is considered a low-cost component in the manufacturing process. The thickness of substrate 120 is about 635 micrometers (μm), prior to wafer back grinding or other thinning process. A plurality of semiconductor die can be formed over or mounted to substrate 120 using semiconductor manufacturing processes as described above. Each semiconductor die has active and passive devices, conductive layers, and dielectric layers formed in active surface 122 according to the electrical design of the die. In one embodiment, the semiconductor die contains baseband analog circuits or digital circuits, such as digital signal processor (DSP), ASIC, memory, or other signal processing circuit.

The semiconductor die may also contain IPD, such as inductors, capacitors, and resistors, for RF signal processing. The IPDs provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions.

A portion of substrate 120 is removed by an etching process to form trench 124. In one embodiment, trench 124 has tapered sidewalls and depth of 10-120 µm.

Figure 3B:
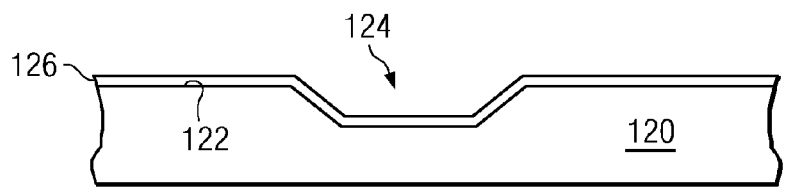

A dielectric or insulating layer 126 is conformally applied over substrate 100 and into trench 124, as shown in FIG. 3b. The insulating layer 126 can be one or more layers of silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having suitable electrical insulating properties. The insulating layer 126 is patterned or blanket deposited using PVD, CVD, printing, spin coating, sintering with curing, or thermal oxidation to a thickness of 0.01 µm.

Figure 3C:
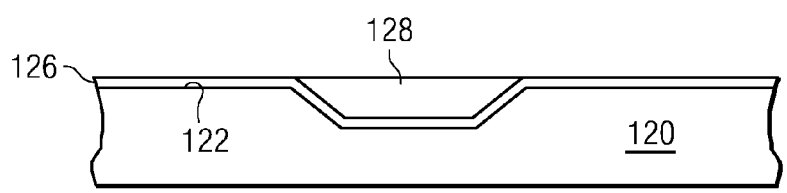

In FIG. 3c, an insulating material 128 is formed over insulating layer 126 and into trench 124. The insulating material 128 can be one or more layers of polyimide, BCB, PBO, or other polymer material applied using low temperature deposition, e.g., in the range of 250-360° C. In one embodiment, insulating material 128 has a low coefficient of thermal expansion (CTE) of 25-60, low loss tangent of 0.01, and low dielectric constant (k) value of 2.9.

Figure 3D:
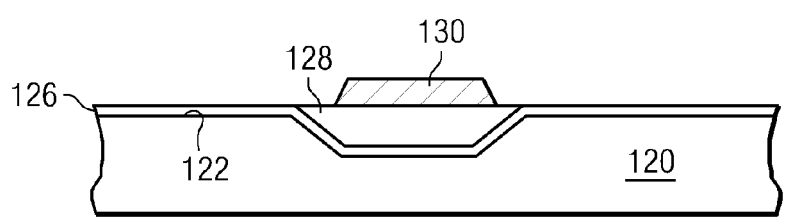

In FIG. 3d, an electrically conductive layer 130 is formed over insulating material 128 using patterning with PVD, CVD, sputtering, electrolytic plating, electroless plating process, or other suitable metal deposition process. Conductive layer 130 can be one or more layers of Al, Cu, Sn, Ni, Au, Ag, or other suitable electrically conductive material.

Figure 3E:
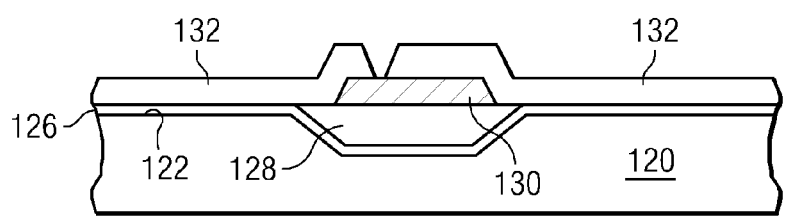

In FIG. 3e, a passivation or insulating layer 132 is conformally applied over insulating layer 126, insulating material 128, and conductive layer 130. The insulating layer 132 can be one or more layers of SiO2, Si3N4, SiON, Ta2O5, Al2O3, or other material having suitable insulating and structural properties. The insulating layer 132 is patterned or blanket deposited using PVD, CVD, printing, spin coating, sintering with curing, or thermal oxidation. A portion of insulating layer 132 is removed by an etching process to expose conductive layer 130.

Figure 3F:
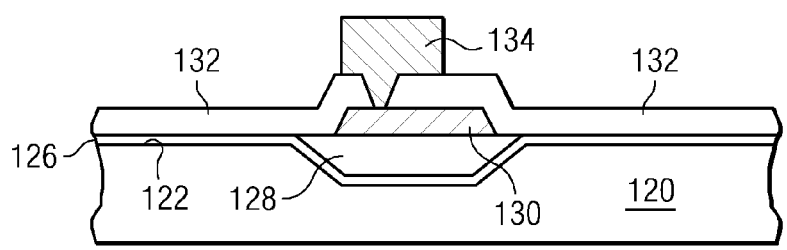

In FIG. 3f, an electrically conductive layer 134 is formed over insulating layer 132 using patterning with PVD, CVD, sputtering, electrolytic plating, electroless plating process, or other suitable metal deposition process. Conductive layer 134 can be one or more layers of Al, Cu, Sn, Ni, Au, Ag, or other suitable electrically conductive material.

Figure 3G:
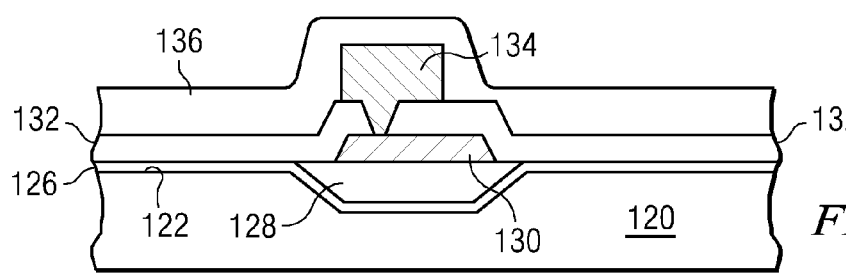

In FIG. 3g, a passivation or insulating layer 136 is conformally applied over insulating layer 132 and conductive layer 134. The insulating layer 136 can be one or more layers of SiO2, Si3N4, SiON, Ta2O5, Al2O3, or other material having suitable insulating and structural properties. The insulating layer 136 is patterned or blanket deposited using PVD, CVD, printing, spin coating, sintering with curing, or thermal oxidation.

Figure 4A:
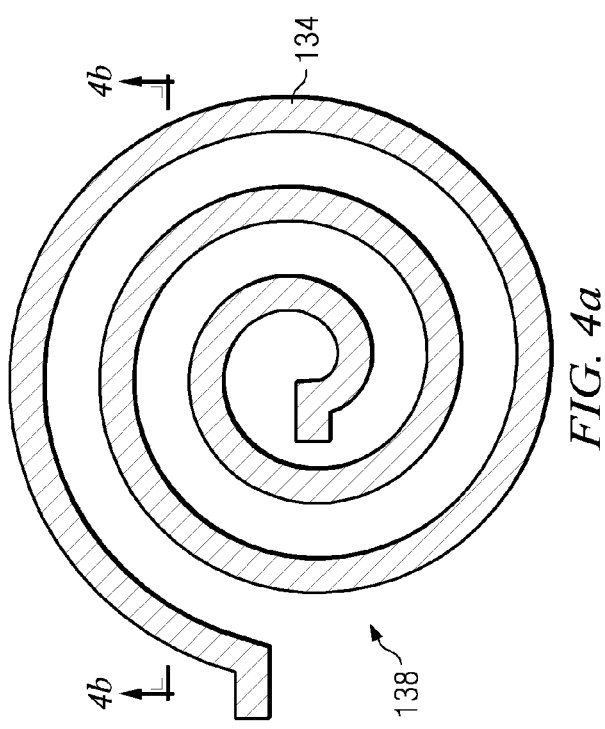
FIGS. 4a-4b illustrate the inductor formed over the insulating material filled trench in the substrate.
Figure 4B:
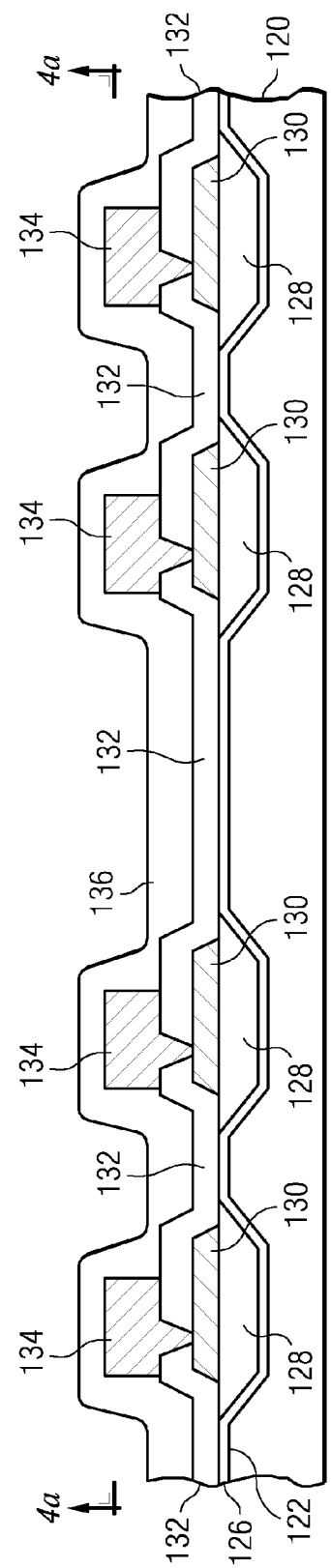

The structure described in FIGS. 3a-3g, including conductive layers 130 and 134 formed over insulating material 128, which is disposed in trench 124, are wound or coiled in plan view to produce or exhibit inductive properties. FIG. 4a shows the plan view of conductive layer 134 coiled to constitute inductor 138 with 1.5 to 4 turns, 30 µm line width and 150 µm inner radius. FIG. 4b shows a cross-sectional view of inductor 138 with conductive layers 130 and 134 formed over insulating material 128, which is disposed in trench 124.

Inductor 138 has a given Q factor, which is a measure of efficiency as the ratio of inductive reactance to resistance at a given frequency. The inductor 138 has a high Q factor, in the range of 40-45 at 2.45 GHz with 80-120 µm deep trench 124. The insulating material 128 formed in trench 124 acts as a buffer to isolate conductive layer 130 and 134 from substrate 120 and reduce dissipation losses through the substrate. The depth of trench 124, filled with insulating material 128, increases the distance between conductive layers 130 and 134 and substrate 120. The insulating material separation decreases inductive coupling between the conductive layers and lossy substrate, which increases the Q of inductor 138. The parasitic capacitance is also reduced with increasing thickness of insulating material 128 and increasing inductor series resonant frequency (SRF). Thus, instead of using an expensive high resistance substrate for the IPD, a simple inductor IPD for use in RF applications can be integrated using a low resistance substrate with a polymer fill trench. The electrical performance or Q is equivalent to that of an inductor Q value in high resistance substrate, providing significant cost savings with equivalent performance.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a trench in the substrate to follow a coiled path;
   conformally applying a first insulating layer into the trench;
   depositing an insulating material in contact with the first insulating layer to fill the trench;
   forming a first conductive layer over a surface of the insulating material opposite the first insulating layer; and
   forming a second conductive layer over the first conductive layer as a coil to exhibit an inductive property, the insulating material in the trench isolating the first conductive layer and second conductive layer from the substrate.

2. The method of claim 1, wherein a depth of the trench is 10-120 micrometers.

3. The method of claim 1, wherein the insulating material includes a polymer material.

4. The method of claim 1, wherein the trench includes tapered sidewalls.

5. The method of claim 1, further including forming a second insulating layer over the first conductive layer.

6. The method of claim 5, further including forming a third insulating layer over the second insulating layer and the second conductive layer.

7. A method of making a semiconductor device, comprising:
   providing a substrate;
   forming a trench in the substrate to follow a coiled path;
   conformally applying a first insulating layer into the trench;
   depositing an insulating material in contact with the first insulating layer to fill the trench; and
   forming a first conductive layer over a surface of the insulating material as a coil to exhibit an inductive property.

8. The method of claim 7, wherein a depth of the trench is 10-120 micrometers.

9. The method of claim 7, wherein the insulating material includes a polymer material.

10. The method of claim 7, wherein the trench includes tapered sidewalls.

11. The method of claim 7, further including forming a second insulating layer over the first conductive layer.

12. The method of claim 11, further including forming a second conductive layer over the first conductive layer as a coil to exhibit an inductive property.

13. The method of claim 12, further including forming a third insulating layer over the second insulating layer and the second conductive layer.

14. A method of making a semiconductor device, comprising:
   providing a substrate;
   forming a trench in the substrate to follow a coiled path;
   forming a first insulating layer into the trench;
   depositing an insulating material in contact with the first insulating layer; and
   forming a first conductive layer over a surface of the insulating material as a coil to exhibit an inductive property.

15. The method of claim 14, wherein the trench includes tapered sidewalls.

16. The method of claim 14, wherein a depth of the trench is 10-120 micrometers.

17. The method of claim 14, further including forming a second insulating layer over the first conductive layer.

18. The method of claim 17, further including forming a second conductive layer over the first conductive layer as a coil to exhibit an inductive property.

19. The method of claim 18, further including forming a third insulating layer over the second insulating layer and the second conductive layer.

* * * * *